(12) United States Patent
Bridges et al.

(10) Patent No.: US 8,446,527 B2
(45) Date of Patent: May 21, 2013

(54) SYSTEM OF PROGRAMMABLE TIME INTERVALS USED FOR VIDEO SIGNAL SYNCHRONIZATION

(75) Inventors: Andrew Bridges, Markham (CA); Siu Kong, Richmond Hill (CA); Malcolm Smith, Toronto (CA); Richard Wong, Markham (CA); Edouard Karam, Toronto (CA)

(73) Assignee: Qualcomm Incorporated, San Diego, CA (US)

( * ) Notice: Subject to any disclaimer, the term of this patent is extended or adjusted under 35 U.S.C. 154(b) by 381 days.

(21) Appl. No.: 12/840,965

(22) Filed: Jul. 21, 2010

(65) Prior Publication Data

US 2011/0019092 A1    Jan. 27, 2011

Related U.S. Application Data

(60) Provisional application No. 61/227,341, filed on Jul. 21, 2009.

(51) Int. Cl.
*H03L 7/00* (2006.01)
(52) U.S. Cl.
USPC ............................. 348/548; 348/500; 348/537
(58) Field of Classification Search
USPC ................. 348/500, 512, 513, 515–518, 508, 348/548, 584, 554, 536–542, 510, 716–717, 348/423, 845.3, 598, 588; 375/355, 357, 375/362; 345/213, 638

IPC ......................................................... H03L 7/00
See application file for complete search history.

(56) References Cited

U.S. PATENT DOCUMENTS

| | | | | |
|---|---|---|---|---|
| 6,141,057 A | * | 10/2000 | Cooper et al. | 348/515 |
| 6,606,127 B1 | * | 8/2003 | Fang et al. | 348/500 |
| 7,071,996 B2 | * | 7/2006 | Naegle | 348/500 |
| 7,359,007 B2 | * | 4/2008 | Wu | 348/581 |
| 8,102,470 B2 | * | 1/2012 | Musunuri et al. | 348/521 |

\* cited by examiner

*Primary Examiner* — Trang U Tran
(74) *Attorney, Agent, or Firm* — Haynes and Boone, LLP

(57) ABSTRACT

A circuit and a method for using the circuit to provide synchronization between a first video signal and a second video signal are provided, comprising a circuit to capture a first video signal, a circuit to measure the timing format of the first video signal including an input clock and count input Vsync pulses, a circuit to measure a phase difference between the first video signal and the second video signal, a circuit to generate an output video signal comprising a number of output Vsync pulses and an output clock, and a PLL circuit to control the output clock period as a constant ratio of the input Vsync period, and maintain a constant number of output clock periods per a number of input clock periods. Also provided is a system to perform the method as above using the circuit as above, maintaining a constant ratio between the output clock period and a number of input clock periods.

21 Claims, 8 Drawing Sheets

SYSTEM OF PROGRAMMABLE TIME INTERVALS USED FOR VIDEO SIGNAL SYNCHRONIZATION

CROSS-REFERENCE TO RELATED APPLICATIONS

This application relates, and claims priority, to U.S. Provisional Patent Application No. 61/227,341, filed Jul. 21, 2009, the disclosure of which is incorporated by reference, in its entirety here for all purposes.

BACKGROUND

1. Field of the Invention

The embodiments described herein relate generally to video processing circuits and methods, and more particularly, to circuits and methods that process multiple input and output video timing formats.

2. Description of Related Art

Digital video timing is characterized by several synchronization signals, including the pixel clock, the horizontal synchronization (HSync), the vertical synchronization (VSync), the pixel/data enable (DE), and the field enable signals. The pixel clock signal indicates when a synchronization, control, and data signals should be sampled by the digital system. The pixel clock rate determines the number of pixel clocks per synchronization signal period (ie. per VSync period and per Hsync period). The horizontal synchronization signal (HSync) indicates the start and end of a horizontal line of pixels. The vertical synchronization signal (VSync) indicates the start and end of a vertical field or frame of lines. The pixel/data Enable (DE) signal indicates when pixels within a horizontal line are active (accompanied by valid data). The number of active (i.e. DE asserted) pixel clocks per frame defines the active resolution of the video format. The field enable signal indicates whether the current interlaced field is Field 0 (low) or Field 1 (high).

Synchronization is defined as maintaining, on average, a constant integer ratio of input Vsync signals to output Vsync signals over an interval of time. For example, a system may be required to maintain 5 output Vsync signals on average for every 3 input Vsync signals received.

These synchronization signals define the timing parameters of many video formats such as standard-definition and high-definition TV. One important function in an electronic video processing system is to synchronize the input and output video format timing, each having separate pixel clocks and corresponding clock rates, respectively.

A format conversion is often needed between the video input and the video output rates that involves changing the number of pixel clocks, the number of active pixels, and/or the number of Hsync samples per field or frame and the position of active pixel data within that field or frame between an input format and an output format.

For example, if the input video format is a North American standard definition video channel, it is formatted using 720 active pixels per 480 interlaced active video lines running at a 13.5 MHz pixel clock frequency. A common practice is to convert this video to a high-definition video format that is defined using 1920 active pixels per 1080 progressive active video lines running at a 150 MHz pixel clock frequency.

An important synchronization signal is the vertical frame rate, also defined as the period of the VSync signal. The vertical frame rate is standardized in North America for broadcast and for wire line transmission to 60 frames per second, although in other jurisdictions other vertical frame rates may be utilized. The VSync signal is used to lock the output frame rate to the input frame rate in systems where no frame-rate conversion is needed. Most often in digital display systems a constant number of pixel clocks per VSync period are required by the display electronics and/or the standard formats' specification.

Modern video processing circuits support an increasingly large array of input and output video timing formats. These formats range from the legacy standard-definition television video (SDTV) up to and beyond the modern ultra-high definition television (UHDTV). The possible range of video synchronization timing varies between these formats from the original 13.5 MHz (SDTV) timing to more than 350 MHz (UHDTV). The difference in synchronization signal intervals and/or pixel clock frequencies (1/period) between existing video timing formats can exceed a ratio of 25:1. Classic pixel clock synthesis and control systems implemented to operate across this range are often costly and require multiple discrete circuits to span the full required range. Moreover, with the advent of new display technologies and new applications for existing technologies, the requirements in terms of adaptability and flexibility of operation for a video processing circuit are expected to increase.

Video input and output formats change frequently during the lifespan of a video display device or application. For example, the latest Blu-ray Disc technical specification supports over 12 different video formats. As another example, modern digital televisions (DTVs) support resolutions that span from SDTV to UHDTV. Consumers expect to switch channels and have the electronic system automatically detect the format change, adjust all internal synchronization signals, and display a perfect picture without any image distortion. For example, electronic display systems typically assume that the synchronization signaling they receive is uninterrupted and maintain a standard video timing format. Classic video synchronization methods do not implement the control that presents a complete spectrum of display output choices to the system in response to input format switching. As a result, classic methods may simply shut off the display system or present it with non-standard (or invalid) video timing that will result in visibly displayed picture distortion.

What is needed is a video processing circuit that can process signals throughout the wide range of available video formats, maintaining uniform quality standards and seamlessly transitioning from a first video format (input) to a second video format (output). In addition, a system is needed to filter or average the input timing variations in the period of the received pixel clock and synchronization signals such that the generated output timing can adapt to period and phase changes in the input timing while rejecting high frequency change in the input timing.

SUMMARY

A circuit and a method to provide synchronization between a first video signal and a second video signal are provided. A circuit according to some embodiments includes a circuit to capture a first video signal, a circuit to measure the timing format of the first video signal including an input clock and count a number of input vertical synchronization (Vsync) pulses, a circuit to measure a phase difference between the first video signal and the second video signal; a circuit to generate an output video signal comprising a number of output Vsync pulses and an output clock, and a PLL circuit to control the output clock period as a constant ratio of the input Vsync period, and maintain a constant number of output clock periods per a finite number of input clock periods. The method includes having a first video signal with a selected input timing format; having a second video signal with a selected output timing format; capturing the first video signal; measuring the timing format of the input video signal and counting a number of input Vsync pulses; measuring a phase difference between the first video signal and the second video signal; generating an output video signal comprising a number of output Vsync pulses and an output clock; and using a PLL circuit to control the output clock period as a constant ratio of the input Vsync period, and maintain a constant number of output pixel clock periods per a finite number of input clock periods.

These and other embodiments of the present invention are further described below with reference to the following figures.

DETAILED DESCRIPTION

Figure 1:
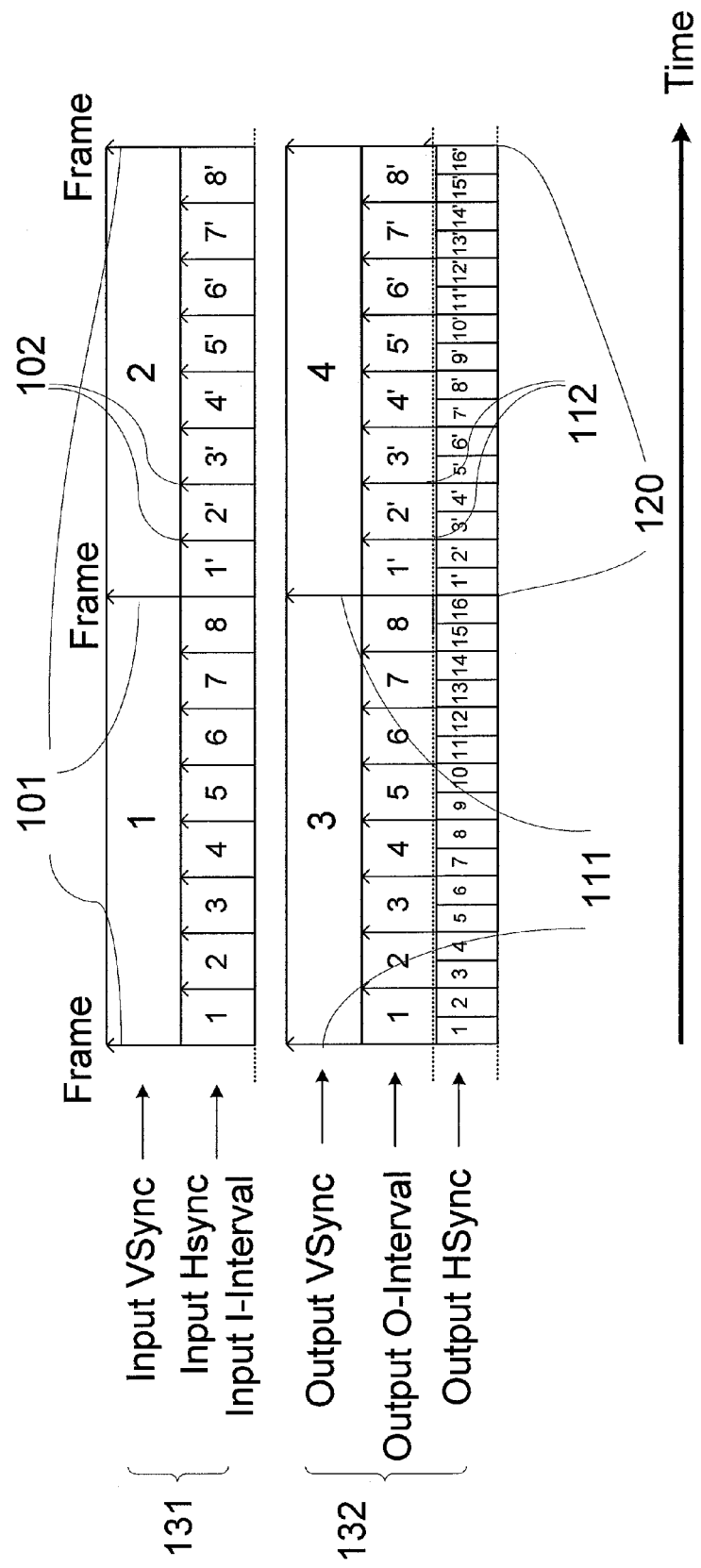
FIG. 1 shows a timing diagram illustrating synchronization between different input and output video signals according to some embodiments of the present invention.

An electronic system and a method to synchronize digital input and output video signals with a wide range of different timing formats are disclosed. The system adjusts the frequency of a phased-locked loop at programmable time intervals, the periods of which are specifically calculated to reduce unacceptable digital clock timing variations used to drive output video timing synchronization signals. Multiple intervals per frame are programmed to occur such that upon each interval an incremental adjustment is calculated and applied to the frequency of the output video pixel clock, in a feedback configuration. A software algorithm that supports per interval input timing changes is also supported and may be used to enhance the PLL control feature set. A fly-wheel timing block can be provided for the input video signal and the output video signal to ensure consistent video timing. Video timing and synchronization can be maintained both in the presence and absence of a real input video signal.

For example, if the video input signal to the system is removed, the system will enter the unlocked state. In the unlocked state, a flywheel shall be capable of continuing to generate synchronization signals at the programmed intervals in phase relative to the last received input synchronization input. The Loop filter modulation circuit shall continue to generate an output pixel clock at the last known valid output clock rate.

For example, if the input Vsync signal period experiences a discontinuity and occurs outside a programmed region about the expected/programmed arrival time of the input Vsync, the system may unlock. Output clock and synchronization timing may be maintained as described above for the unlocked state. Causes of Vsync discontinuity may be a result of (but not limited to) a change in input timing source, a change in the received input format, or an external input timing fault/aberration.

The system contains a mechanism to re-enter the locked state from the unlocked state by either a) controlling/modulating the PLL output clock frequency to cause the output Vsync programmed period ratio and phase synchronization relationship with the input Vsync to resume over a period of time, or b) produce a discontinuity in the output synchronization timing such that synchronization is immediately reestablished.

The system and method provided can be adapted to work with any standard, phased-locked loop (PLL) architecture having a dynamic high-resolution fractional frequency control, and can be implemented in hardware, software, or a combination of hardware and software for maximum user flexibility.

In some embodiments of the present invention, the input video circuit further includes an input video clock, while an input flywheel block includes an input timing circuit configured to accept VSync and Interval signals and provide the VSync signal to the rest of the system when the input signal is lost or experiences a discontinuity. An input sync event generator creates a master synchronization signal that is transmitted to an input sync extraction system to provide interval and Vsync signals to an output timing circuit.

The output timing circuit, or output flywheel block, ensures consistent video timing, whether or not the input flywheel is providing timing signals. The output timing circuitry further includes an output video synchronization clock to receive data from the input sync extraction system, an interval phase detector, a lock detector, and a loop filter modulation circuit that calculates the amount of frequency adjustment required to keep the input and output video timing locked. Within the output flywheel block, a frame error term $\delta V$ (cf. FIG. 5a below) is calculated every N frame periods by the interval phase detector. Error term $\delta V$ is a measure of the difference between the Vsync signal received from the input flywheel and the output Vsync signal generated by the output flywheel. Also within the output flywheel block, at each programmable timing interval, an interval error term ($\delta I$) is calculated by the interval phase detector. Error term $\delta I$ is a measure of the difference between the interval signal received from the input flywheel and the interval signal generated by the output flywheel. Error terms $\delta V$ and $\delta I$ are applied to the loop filter modulation circuit. A phase-locked loop (PLL) accepts incremental adjustments, once per output flywheel generated interval, to the output video synchronization clock as calculated by specific programming of the loop filter modulation circuit.

The loop filter modulation circuit calculates corrections applied to the PLL to control the output pixel clock period. The corrections are calculated to maintain, within the tolerance of the loop filter configuration, a target output pixel clock period as a constant ratio of the input VSync frequency. The bandwidth and amplitude of frequency modulation applied to the PLL output pixel clock frequency is maintained according to the programming of a proportional filter and an integrating filter within the loop filter modulation circuit.

FIG. 1 illustrates an ideal input-to-output video timing with identical frame rates but different formats. As shown in FIG.

1, the input video signal adheres to input timing 131 while the output video signal adheres to output timing 132. The idealized diagram depicted in FIG. 1 contains an example input timing 131 formatted with 8 lines per video frame. There may be any number of individual pixels in each line of a specific video format. Output timing format 132 has 16 lines per video frame. Note that the period of frame synchronization VSync signals 101 and 111 are identical, which produces a consistent output frame rate that equals the input frame rate, for example a rate of 60 Hz.

The role of the display electronics is to provide an output display image to a user from an input display image. According to embodiments having timings consistent with that example depicted in FIG. 1, an input video format includes video frames 1 and 2 having eight (8) sub-frame intervals (1-8 and 1'-8', respectively). The input video frames are bound in time by signal 101, which is an input vertical synchronization signal (VSync) and includes signal 102 within each period. Signal 102 is an input interval synchronization signal (I-Interval) that provides a sub-frame granularity of control and is arranged such that eight periods of signal 102 occur within one period of signal 101. I-Interval 102 may be an input horizontal line synchronization signal (Hsync) according to some embodiments of the present invention. I-interval 102 may not be limited to be an Hsync signal, according to some embodiments of the present invention. The output video format includes video frames 3 and 4 having eight (8) O-intervals (1-8 and 1'-8', respectively). Output video frames 3 and 4 are bound in time by Vsync signal 111, which is an output vertical synchronization signal. Signal 112, which includes the output interval (O-interval) signal, includes 8 periods within each period of output VSync signal 111. Each pulse in signal 112 is an output interval synchronization signal controlling the output timing of the video image. In the embodiment depicted in FIG. 1, the period and phase of output signal 111 is synchronized ideally to the period and phase of input signal 101, thus providing synchronized input and output video frames. In general, this synchronization relationship is a ratio of N output Vsync periods to M input Vsync periods, where M and N are natural numbers. The interval synchronization relationship is such that the period of O-Interval 112 must be made equal to the period of I-Interval 102.

According to some embodiments of the present invention, the addition of the interval periods where several intervals per frame is used to distribute smaller incremental corrections over an output Vsync period may allow the system to maintain a constant ratio of M/N. In some embodiments of the present invention, the output clock period may be controlled by a PLL circuit as a constant ratio of the input Vsync period. Furthermore, according to some embodiments the output clock period (via PLL control) is maintained as constant ratio of an input interval. In some embodiments of the present invention, the input interval may be a finite number of input clock periods. Thus, by maintaining a constant number of output pixel clocks per output Vsync, a mechanism where the output Vsync period will track an M/N ratio relationship with the input Vsync may be achieved.

In the embodiment depicted in FIG. 1, input and output video frame rates (i.e. Vsync periods 101 and 111) are identical (i.e. M=N=1). However, because the video timing format of the output differs from that of the input, a different number of output horizontal lines and pixel clocks per Vsync relative to the input frame may be used. The system maintains the number of output horizontal Sync signals 112 per output VSync as constant while performing Video Synchronization. This is done by controlling the PLL output clock frequency while maintaining a constant number of output pixel clocks per VSync. The net result is a seamless, flicker-free conversion from an input video format to an output video format.

Figure 2:
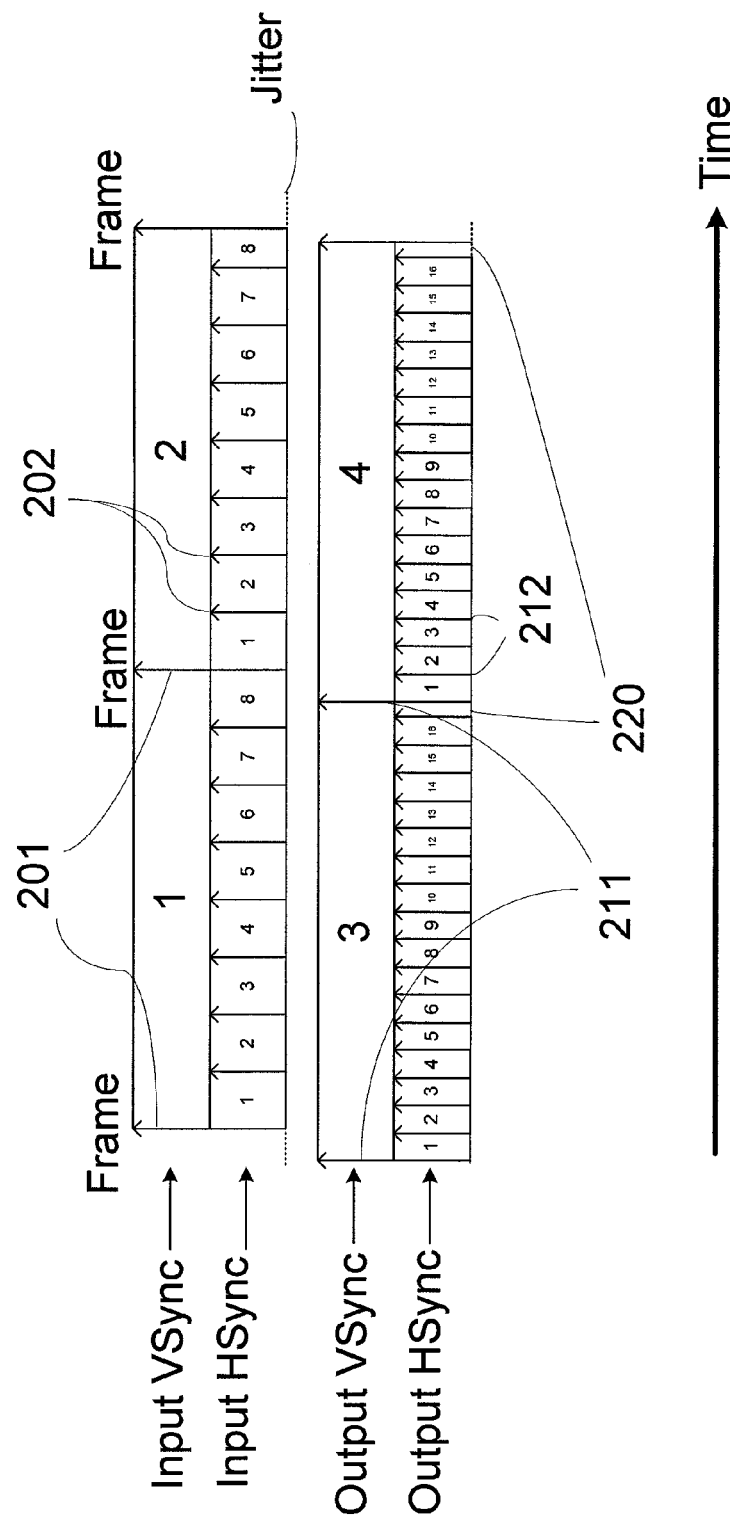
FIG. 2 shows an input and output video timing diagram with non-ideal synchronization according to some embodiments of the present invention.

FIG. 2 shows an embodiment of the present invention where the input and output frame periods have a frame timing (VSync) that is similar, but not identical, to one another. The non-idealized video timing illustrates that in this timing situation, there is a possibility that the input VSync timing 201 jitters or drifts slightly from frame-to-frame due to the non-ideal generation of the pixel clock timing from the source video generator (not depicted in FIG. 1). Also, FIG. 2 shows that the output VSync timing 211 is asynchronous relative to input VSync timing 201, and the input timing 201 may change drastically relative to output timing 211 as the user adjusts the DTV channel or video source, meaning that VSync timing 201 will vary widely in frequency and/or phase until the source is settled and locked.

In order to preserve video image quality and continuity, output video timing 211 may not be changed while input synchronization signals 201 and 202 are unstable. During this time the system must maintain constant output timing that is not synchronized to the input until the input becomes stable. Once the input timing has stabilized synchronization of the output pixel clock and VSync can be achieved with the input video signal 201. The embodiments described in FIGS. 3 through 6 address the three issues illustrated in FIG. 2.

Figure 3:
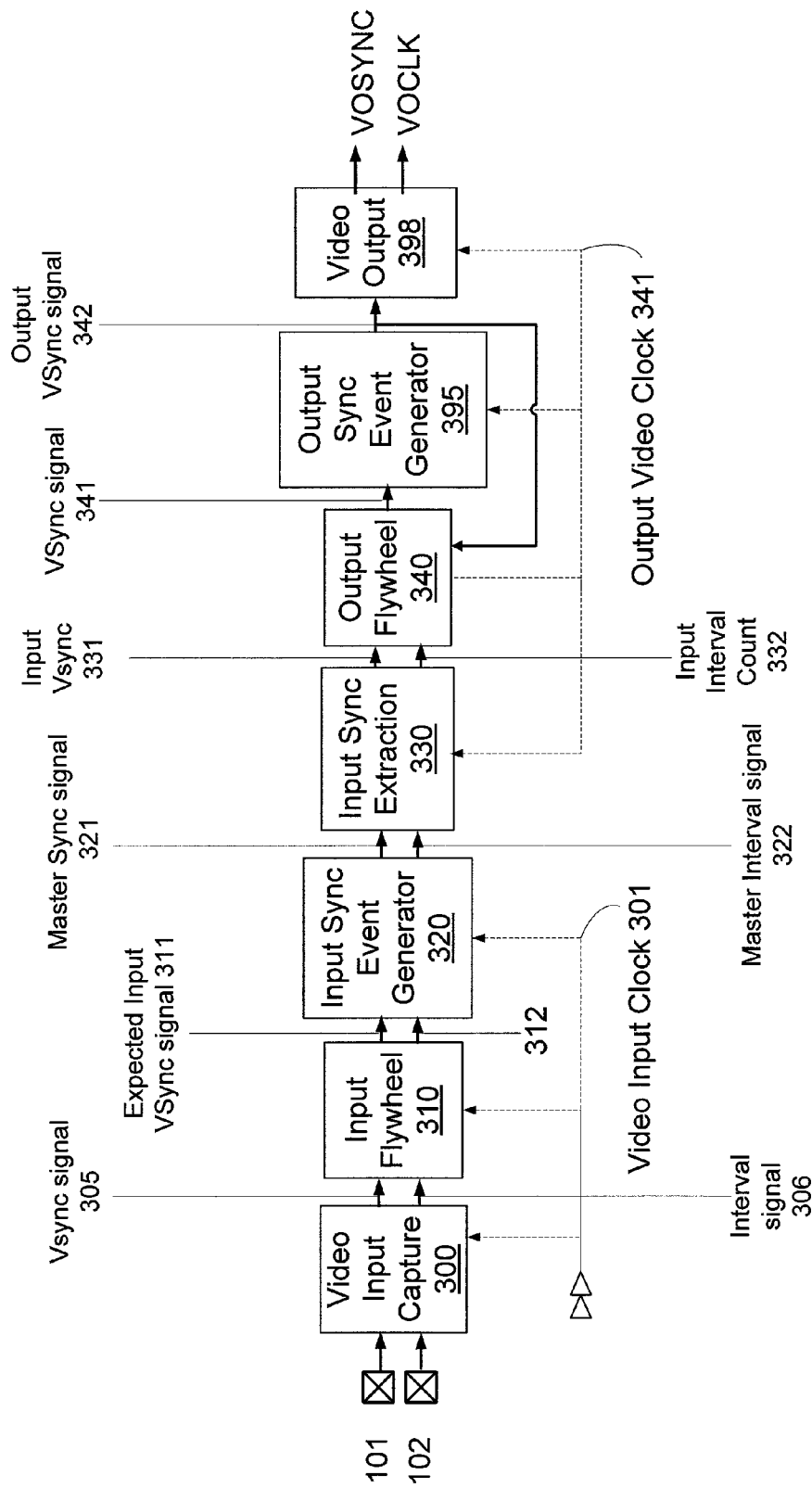
FIG. 3 shows an embodiment of the present invention depicting a system diagram.

FIG. 3 shows a block diagram that illustrates some embodiments of the present invention. As shown in FIG. 3, video input synchronization signals 101 and 102 (cf. FIGS. 1 and 2) enter the system into the video input capture block 300. Block 300 synchronizes the input video timing to video input clock 301. The number of clock cycles between VSync 101 cycles, and between I-interval signal events 102 are calculated by video input capture block 300 and fed forward to input flywheel 310 as VSync signal 305 and I-interval signal 306. Input flywheel block 310 provides input VSync signal 311 and I-interval signal 312 to input sync event generator 320, based on input VSync signal 101. Signals 321 and 322 may be reproductions of signals 305 and 306, respectively. In the event signals 306 or 305 are not received within a expected (programmed) input flywheel interval, signals 322 and/or 321 are synthesized by block 320.

Input VSync signal 331 and Input Interval Count 332 may reproduce signals 321 and 322, respectively. Signals 331 and 332 may have been re-sampled in terms of the output pixel clock, according to some embodiments of the present invention. Signals 331 and 332 are provided to output flywheel clock generator block 340. Output flywheel circuit 340 employs feedback logic in order to generate top-of-frame (VSync) signal 341, which will eventually become an output VSync signal. VSync signal 341 is sent to output sync event generator circuit 395, which generates an output VSync signal 342 that is fed back into output flywheel circuit 340, to be used for adjusting synchronization between input signal 331 and output VSync signal 342. In some embodiments of the present invention, output VSync signal 342 may include a pulsed signal that is generated after a certain number, Y, of output video clock 341 cycles, as will be described in detail with reference to FIG. 5, below.

Figure 4:
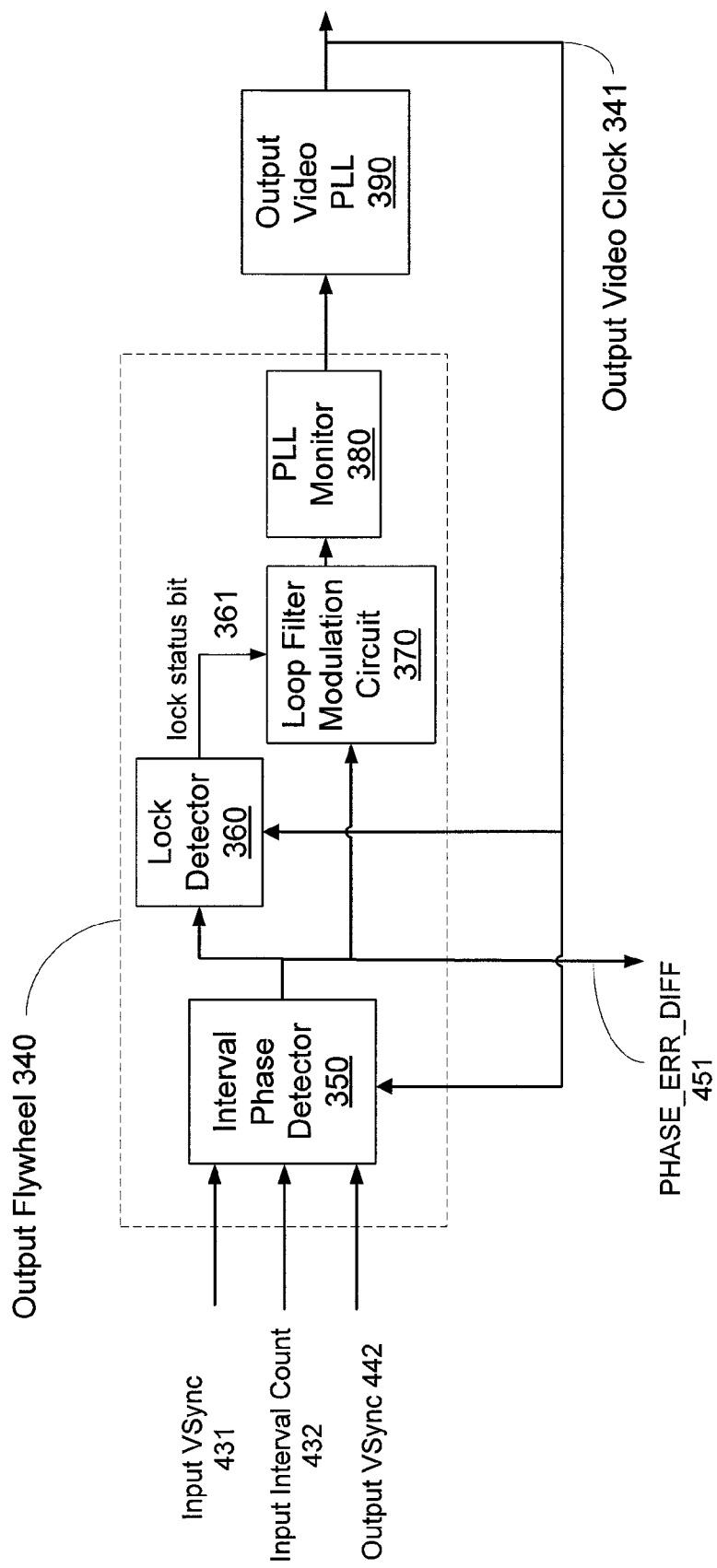
FIG. 4 shows the block diagram of an output flywheel circuit according to some embodiments of the present invention.

FIG. 4 illustrates some embodiments of output flywheel block 340 including an interval Phase Detector 350, a Lock Detector 360, a Loop Filter Modulation Circuit 370, a PLL Monitor 380, and an Output Video PLL 390.

Interval phase detector 350 compares input VSync signal 431, interval count signal 432, and output VSync signal 442 to generate a phase error difference value 451. This value measures the amount of adjustment to be applied to the frequency of output clock signal 341 by output video PLL circuit 390 to keep input and output VSync signal 442 synchronized with the video input Vsync signal 331. The amount of adjustment is controlled by programming loop filter modulation circuit 370 to control PLL circuit 390 within format timing specifications and to ensure that the output of PLL circuit 390 does not become unstable. Lock detector block 360 detects whether the current output flywheel system has already achieved a locked-state between the input and output video timing, and provides lock status bit 361. This information determines how much adjustment output video PLL block 390 should apply to maintain lock. PLL monitor circuit 380 prevents the sending of a severe adjustment to output video PLL 390 that may destabilize the output frequency.

Loop filter modulation circuit 370 calculates the amount of adjustment to the frequency of output pixel clock signal 341 required to keep input and output video timing locked. Variations in the input clock are tracked by generating an input I-interval signal every X input clock cycles, for comparison with an output O-interval generated every Y output clock cycles. This ensures that the phase-locking procedure takes place over a certain number of clock signals, thereby averaging out transient random variations. If the output interval is of greater period than the input interval, then output flywheel circuit 340 is programmed to reduce its clock period; the converse scenario is also true. As a result, input clock variation can be quickly compensated in the output clock phase and frequency. This also ensures that the phase of output VSync signal 442 deviates minimally from the phase of input VSync signal 431.

Figure 5A:
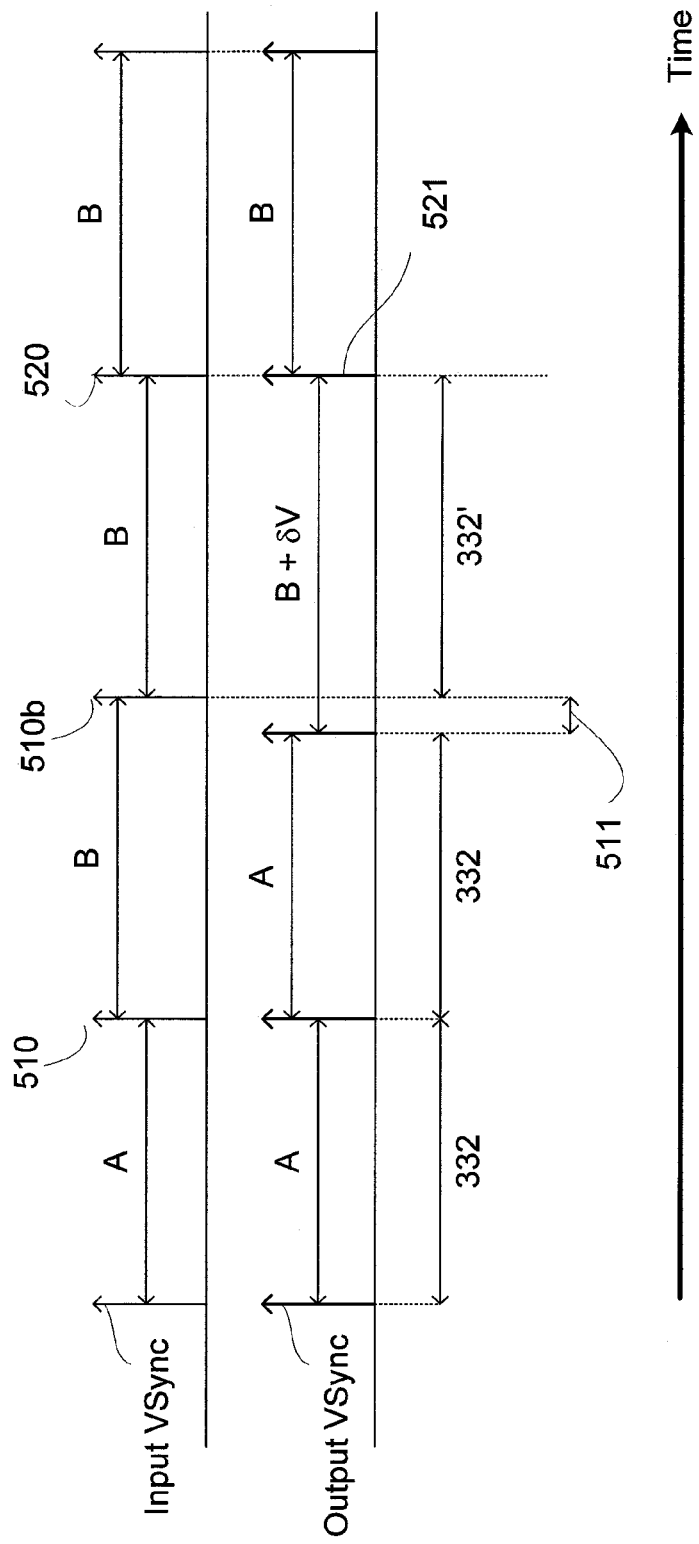
FIG. 5a shows an Input and Output video synchronization scheme as disclosed in some embodiments of the present invention.
Figure 5B:
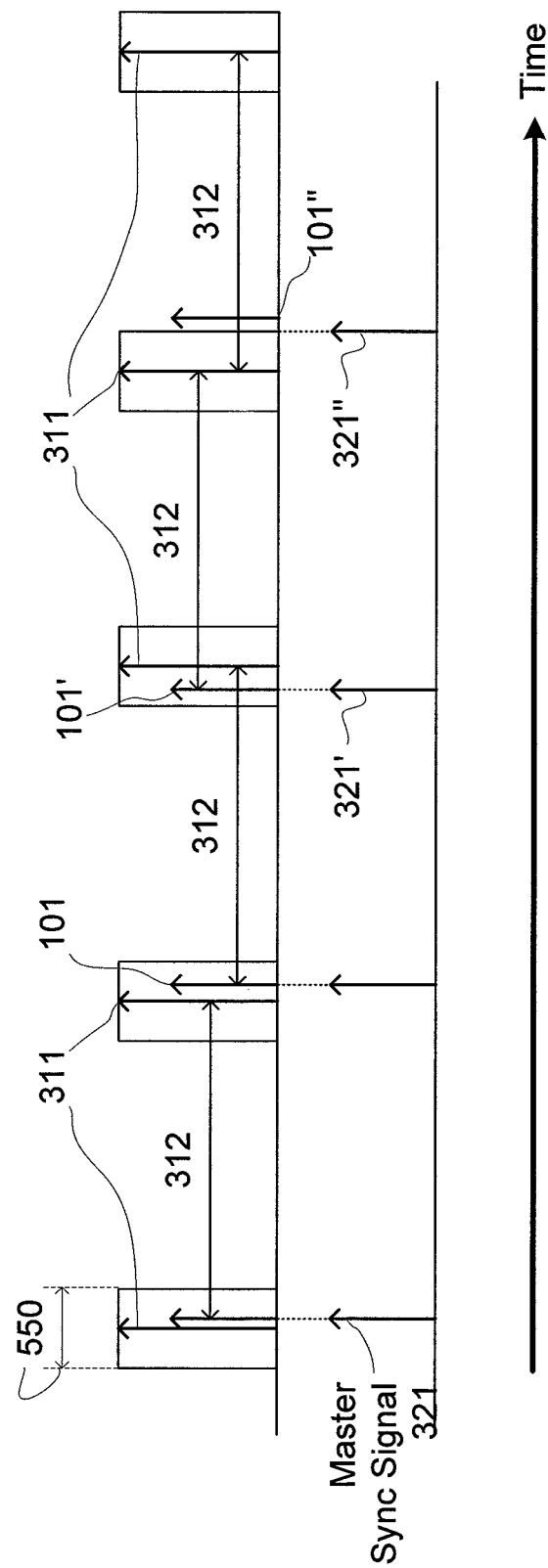
FIG. 5b illustrates how a sync mask window filters slight jitter in the input video timing.

FIGS. 5a and 5b illustrate in detail a synchronization technique according to some embodiments of the present invention. FIG. 5a illustrates the occurrence of an unexpected time-difference or discontinuity in the input Vsync period such that a period B is input instead of the expected period A. The expected output Vsync period A may be controlled by the system to adapt to the discontinuity and achieve a new Vsync period B, according to some embodiments of the present invention.

FIG. 5a shows an input VSync signal having an input period A, which transitions to a new period B at input signal 510, according to some embodiments of the present invention. Input period A is provided to output flywheel block 340 by signal 331 from extraction circuit 330 (cf. FIG. 3). The output VSync signal depicted in FIG. 5a starts in synchronization with input VSync (time increases from left to right in FIG. 5a). When input VSync signal 510b is detected, then a phase lag 511 is measured by interval phase detector 350 in output flywheel block 340 (cf. FIG. 4). Phase lag 511 is also referred to as 'δV' in FIG. 5a. The new Vsync period B is measured by input flywheel block 310 and provided to block 340 by extraction circuit 330 via signal 331; therefore, block 340 may adjust the output time interval to be equal to B, and apply a frequency correction to the output pixel clock period sufficient to compensate for the phase shift 'δV' to the Vsync and for the change in VSync period so that pulse 521 occurs in synchronicity with input pulse 520. Input and output VSync will be synchronous thereafter, until a new change occurs in input VSync. Note that FIG. 5a illustrates an embodiment of the present invention wherein the synchronization process takes place in one or two frames. Some embodiments of the present invention will require a number of frames to pass by through the entire circuit depicted in FIG. 3 in order to achieve a statistically accurate lock of the output Vsync period with the input Vsync period.

According to some embodiments of the present invention, a method for distributing the magnitude of PLL adjustments over a Vsync period may be provided. This may be achieved by performing several corrections to the PLL output pixel clock period per VSync period. One correction may be performed for each O-interval period, according to some embodiments of the present invention. Loop filter modulation circuit 370 (cf. FIG. 4) will compare every O-interval period with its corresponding I-interval period to determine the interval error term 'δI'. It will then calculate a corresponding adjustment to the PLL output pixel clock period according to the programming and operation of the loop filter control circuit. The correction sequence at interval in response to each 'δI' terms is analogous to the correction at each Vsync in response to each 'δV' terms as depicted in FIG. 5a. In some embodiments, the reduction in magnitude of the PLL adjustment made each Vsync period as a consequence of performing these distributed PLL adjustments at each interval within the VSync period may be accomplished.

In some embodiments of the present invention, the synchronization scheme illustrated in FIG. 5a may take place within a plurality of input video frames, with a small adjustment in phase and frequency performed in each frame, thereby obtaining a complete synchronization between input and output video signals gradually, after a plurality of input video frames has passed by.

The ability of output flywheel circuit 340 to detect, measure, and control a phase shift between input VSync signal and output VSync signal by using PLL monitor 380 and output video PLL circuit 390, while having a measure of input time interval from input flywheel block 310, allows output flywheel 340 to recover synchronicity after a time-shifting or frequency-shifting event. It also prevents output flywheel 340 from falling into a region of instability, or a bi-stable state, which commonly occurs between video signals transitioning from a first frequency to a second frequency that is a rational fraction or a rational multiple of the first frequency. To further prevent output flywheel 340 from falling into instability regions, a sync mask window is introduced, as described below.

FIG. 5b illustrates how the introduction of sync mask window 550 in input sync event generator 320 tolerates small amounts of jitter of input VSync signal 101. As was discussed in relation to FIG. 3, expected input VSync signal 311 is generated by input flywheel 310 based on a measurement of the input VSync signal 101. Expected input VSync signal 311 is passed on to input sync event generator 320 (cf. FIG. 3). Sync mask window 550 is a preselected time interval centered on each of the expected input VSync events 311. Any shift of input VSync signal 101 producing a pulse 101' within the time interval defined by sync mask window 550 is considered valid, and master sync signal 321 is adjusted to compensate for the time shift so that a master sync pulse 321' remains phase-locked with the actual input VSync signal 101'. Note that in this case master sync signal 321' output will not coincide with expected input VSync signal 311; this mismatch is tolerated as long as it occurs within sync mask window 550. However, if input VSync signal 101 is strongly uttering and a pulse 101" lands outside the sync mask window, master sync signal 321" is generated at the trailing edge of sync mask window 550. The frequency correction resulting from this signal by output flywheel block 340 accounts for the allowed time shift within sync mask window 550 because the time shift naturally becomes a component of the next 'δV' error term. As described in relation with FIG. 5a, the fact that a small phase shift may be left uncorrected in the first frame in a situation as depicted by input VSync 101" does not prevent output flywheel 340 from achieving a complete synchronization after a number of input video frames have passed because a gradual time adjusting will be performed during each frame cycle, as described above.

Figure 6:
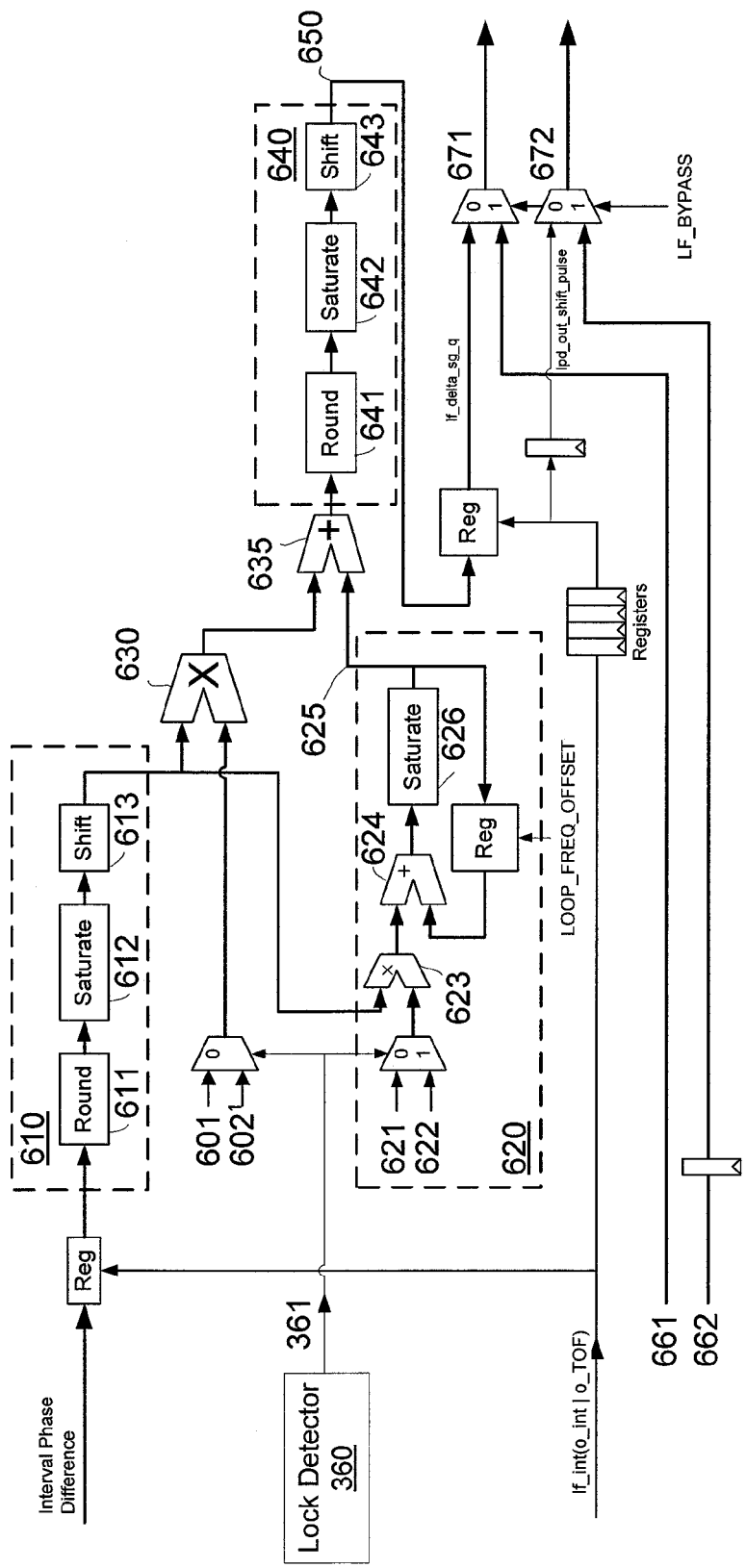
FIG. 6 shows in detail a loop filter modulation circuit as disclosed in one embodiment of the present invention.

FIG. 6 illustrates an embodiment of loop filter modulation circuit 370 that can be used in output flywheel block 340 (cf. FIG. 4). The Interval Phase Difference (IPD) value is either the 'δV' or 'δI' term as generated in the interval phase detector circuit 350 (cf. FIG. 4). Upon each O-interval, the 'δI' is selected as the IPD and upon each VSync, the 'δI' is selected as the IPD. The IPD is stored in a register (labeled 'Reg' in FIG. 6) before it is processed by programmable blocks Round 611, Saturate 612 and Shift 613 blocks in stage 610 to ensure the adjustment applied to output video PLL 390 (cf. FIG. 4) is within a tolerable range. Round block 611 rounds positive phase difference -up-, and negative -down- to preserve precision. Saturate block 612 clamps (i.e. limits) the amplitude of the 'δV' or 'δI' terms delivered into the loop filter modulation block 370 (cf. FIG. 4). Shift block 613 normalizes the rounded and clamped IPD to the dynamic range required for the loop filter calculation. This IPD is multiplied in stage 630 by a gain factor selected between unlock coefficient 601 and lock coefficient 602. The selection of either 'lock' 602 or 'unlock' 601 coefficient as a multiplier depends on lock status bit 361, which indicates the status of output video PLL circuit 390, as monitored by lock detector circuit 360 (cf. FIG. 4). Lock detector circuit 360 provides lock status bit 361 that may attain a value '0', for an unlocked signal, and '1', for a locked signal. 'Unlock' coefficient 601 is larger than 'lock' coefficient 602 and forces a more rapid frequency adjustment of output video PLL 390. The value of 'lock' coefficient 602 is selected to keep the system stable and to track the input video timing.

After the gain factor from either of the 'lock' 602 or 'unlock' 601 coefficients is selected, the value is added to integrated coefficient 625 in stage 635. Coefficient 625 is generated in loop integrated coefficient circuit 620. Loop integrated coefficient circuit 620 is part of loop filter modulation circuit 370 (cf. FIG. 4) and generates integrated coefficient 625 by adding the amount of modulation required over many intervals (or input video frames) during integration stage 624. The integrated value thus obtained includes a factor for integrated 'lock' 621, or 'unlock' 622 coefficients, introduced at stage 623. The selection of an integrated 'lock' 621 or 'unlock' 622 coefficient is controlled by lock status bit 361. A saturate function 626 is used within circuit 620 in order to maintain the value of coefficient 625 within a pre-selected bound, in the same manner as saturate function 612. Each value of coefficient 625 is stored in a register before being added during integration stage 624. The use of integrated coefficient 625 allows output flywheel block 340 to introduce a "learning" component in the feedback loop process, and the instability in output video PLL 390 induced by sudden changes in the frequency modulation signal or other voltage surges within block 340 can be avoided.

The final Round 641, Saturate 642, and Shift 643 functions in stage 640 ensure that the adjustment to the output video PLL circuit 390 provided by modulation signal 650 is within bound. Finally, input signals 661 and 662 are the software override values that may be provided by a computer processing unit (CPU) running a purely software-based algorithm to bypass signal 650, which is produced by hardware. The software based algorithm essentially performs the same operations as described in relation to output flywheel block 340 and FIG. 4, above. All operations described in FIG. 4 and FIG. 6 are stored in a memory device that communicates with the CPU circuit and drives output video PLL circuit 390. Signal 661 is the updated digital value applied to PLL circuit 390 to affect the new pixel clock period. Signal 662 includes a trigger signal for circuit 390 to respond to signal 661.

In the embodiments depicted in FIG. 6, coefficients 601, 602, 611 and 612 have pre-selected values that determine the response time (i.e. bandwidth) and stability of output flywheel block 340. Different video synchronization applications may require a different set of coefficients for optimal performance of obvious variations of the embodiments of the invention disclosed herein. For example, some embodiments of the present invention may require a high bandwidth where the term 'high bandwidth' is used in reference to frequency of modulation in the order of 30 KHz.

Figure 7:
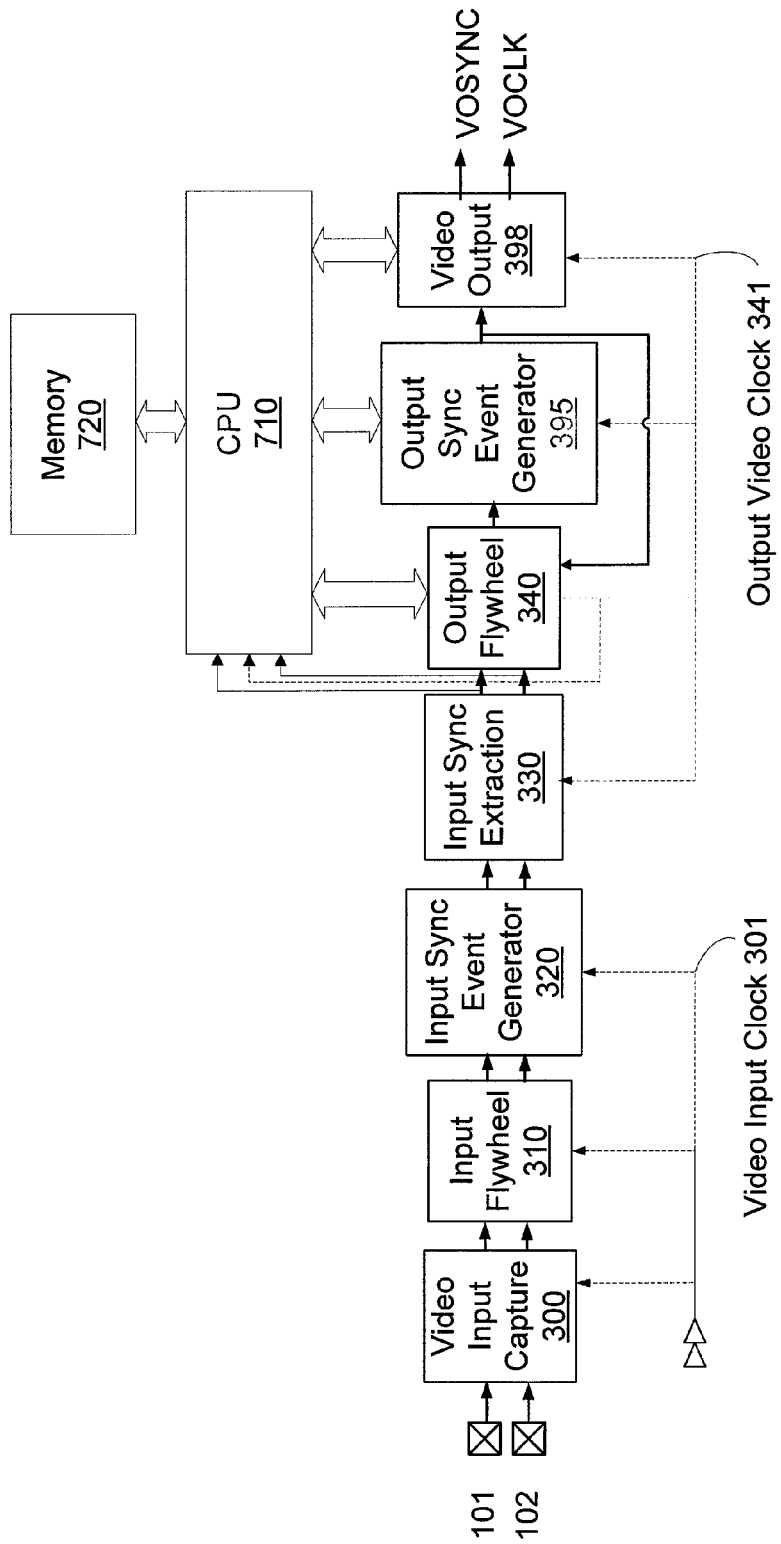
FIG. 7 illustrates a system to provide synchronization between a first video signal and a second video signal according to some embodiments of the invention.

FIG. 7 illustrates a system to provide synchronization between a first video signal and a second video signal according to some embodiments of the invention that combine hardware and a software algorithm executed on a processor or CPU circuit 710, further using memory circuit 720 to store data. In some embodiments of the invention, a combination of electronic circuits and software algorithms may be employed in order to more effectively take advantage of a specific property of a given circuit or software processing capability, while maintaining the overall sequence and logic of the steps and procedures described heretofore, as one of regular skills in the art of video signal processing and digital signal processing would realize. In FIG. 7, memory circuit 720 stores commands that will be executed by CPU circuit 710 to control the operation of output flywheel circuit 340, output sync event generator 395, and video output circuit 398. CPU circuit 710 receives data provided by the train of blocks including video input capture block 300, input flywheel block 310, input sync event generator block 320, and input sync extraction block 330, as described in FIG. 3 above. The data provided to CPU circuit 710 includes input VSync signal 331, input interval count 332, and the output video clock 341 provided by output flywheel block 340.

Some embodiments of the present invention as depicted in FIG. 7 may use a software algorithm. The algorithm listed below, which is a part of this disclosure, represents a sequence of operations stored in memory 720 that can be carried out by CPU 710 in order to control output flywheel circuit 340 and each of the blocks described in FIG. 4. The algorithm makes use of intervals to dynamically adjust the Output Video PLL to maintain a constant input and output video format ratio can also be included in a software algorithm. The algorithm shown below performs three main operations: it lets the hardware represented by blocks 340, 395, and 398 drive the synchronization process until a lock status is achieved. At this point, there will still be a phase difference between the input video signal and the output video signal that needs to be corrected. After the lock status has been achieved, the algorithm makes adjustments in the timing of the output video signal in order to reduce the phase difference below a pre-selected threshold. As the adjustments are being made, the algorithm ensures that the coefficients used in output flywheel block 340, namely 601, 602, 621, 622 and 623 are gradually decreased in magnitude, so that the adjustments become finer.

Embodiments of the invention described above are exemplary only. One skilled in the art may recognize various alternative embodiments from those specifically disclosed. Those alternative embodiments are also intended to be within the scope of this disclosure. As such, the invention is limited only by the following claims.

| Software Algorithm for Input and Output Video Timing |
|---|

```
/*
VPLL Modulation
In short :
1. Let HW proportional drive modulation alone until it gives "locked" status. (At which point
there will still be a phase difference)
2. Then allow SW to make adjustments to make phase difference smaller to some threshold.
3. At the same time while locked, gradually decrease the coefficients so that the adjustments
become finer.
*/
void PllModMonitor ( )
{
   //Read the osync interval count value so we can keep track of where we are and do something
once a frame
   //In order to read it, first have to set OSYNC_OFLY_PLL_MOD_STATUS=1 (then clear it after
reading)
   previousOsyncIntervalCount = currentOsyncIntervalCount;
   DSPHAL_REGLD ( offOSYNC_OFLY_PLL_MOD_STATUS_CTRL, 1 ) ;
   currentOsyncIntervalCount = DSPHAL_REGRD (offOSYNC_OFLY_PLL_MOD_OINT_CNT) ;
   DSPHAL_REGLD ( offOSYNC_OFLY_PLL_MOD_STATUS_CTRL, 0 ) ;
   if (previousOsyncIntervalCount != currentOsyncIntervalCount )
   {
      //Add error correction into PLL clock frequency setting (CLKF)
      uint32 CLKF_INT, CLKF_FRAC;
      uint32 delta;
      int32 deltaS;
      long long clkf;
      int32 coeff;
      int32 shrinkCoeff;
      int32 clocksOff;
      uint32 modLock;
      uint32 currentTime;
      delta = DSPHAL_REGRD (offOSYNC_OFLY_LF_DELTA_SG) ;
      //Sign extend the delta
      if (delta & (1<<27) ) //Bit27 is set
      {
         delta = delta | 0xF0000000;
      }
      deltaS = (int32)delta; // proportional delta value as HW would have applied it
      while (currentOsyncIntervalCount == 1) // Integration portion done once per frame
      {
         //Adjustable parameters from spare virtual registers
         int32 coeffDivider = (int32) (REG_SPARE_00.field > 0 ? REG_SPARE_00.field : 1) ;
//Make sure it's not zero
         int32 coeffThreshold = (int32) REG_SPARE_01.field;
         int32 clocksOffThreshold = (int32) REG_SPARE_02.field;
         int32 deltaDivider = (int32) (REG_SPARE_03.field > 0 ? REG_SPARE_03.field : 1) ;
//Make sure it's not zero
         uint32 modLockTimeout = REG_SPARE_04.field;
         currentTime = debug_info [ENUM_DEBUG_INFO_ MAIN_LOOP_MILLISEC_COUNT] ;
         coeff = (int32) DSPHAL_REGRD (offOSYNC_OFLY_LF_PR_COEFF_LOCK) ;
         modLock = DSPHAL_REGRD (offOSYNC_OFLY_PLL_MOD_STATUS) ;
         //Do this before the break below
         //Once the VPLL is locked, gradually shrink the coefficients so that HWPLL makes
finer adjustments.
         //If the shrunken coeff is greater than a threshold (adjustable) , then write it into
the register. This is so that we stop shrinking at some point.
         shrinkCoeff = (coeff * (coeffDivider-1) ) / coeffDivider;
         if (modLock && (shrinkCoeff > coeffThreshold) )
         {
            DSPHAL_REGLD ( offOSYNC_OFLY_LF_PR_COEFF_LOCK, (uint32) shrinkCoeff ) ;
            DSPHAL_REGLD ( offOSYNC_OFLY_LF_PR_COEFF_UNLOCK, (uint32) shrinkCoeff ) ;
         }
         //This part is to stop the SW from making anymore clock adjustments once the phase
difference is small enough (adjustable)
         //Don't apply clock change if # of clocks off is less than certain amount
         if (0 == coeff)
            break; //Don't try to divide by zero
         clocksOff = deltaS/coeff;
         clocksOff = (clocksOff<0) ? -clocksOff : clocksOff; //Absolute value
         if(clocksOff < clocksOffThreshold)
            break;
         if ( !modLock && ( (currentTime < (startVideoTime+modLockTimeout) ) && (currentTime >
startVideoTime) ) )
            break; //Don't use SW integration to modify clock until HW proportional brings
it to "locked" state. Timeout handles case if clocks differ so much lock will not occur without
integration.
         // If the phase difference is not small enough, then apply a fraction of the delta
into the permanently to clock value,
```

| Software Algorithm for Input and Output Video Timing |
|---|
| ```
        // but only after we let the HW adjust by itself enough so that it is "locked" or
when a timeout occurs .
            deltaSInt += deltaS / deltaDivider;
            break; // exit dummy loop
        }
        clkf = originalClkf + deltaS + deltaSInt; // add proportional and integrated clock
adjustment to the base value
        //Disassemble the INT and FRAC parts
        CLKF_INT = (uint32) (clkf >> 26) ;
        CLKF_FRAC = (uint32) (clkf & 0x3FFFFFF) ;
        DSPHAL_REGLD ( offCLK_VPLL_CLKF_INT, CLKF_INT ) ;
        DSPHAL_REGLD ( offCLK_VPLL_CLKF_FRAC, CLKF_FRAC ) ;
        DSPHAL_REGLD ( offCLK_VPLL_UPDATE_DWT, 0xF ) ; //Force trigger
    }
        }
``` |

What is claimed is:

1. A circuit to provide synchronization between a first video signal and a second video signal, comprising:
   a circuit to capture a first video signal;
   a circuit to measure a timing format of the first video signal including an input clock, and count a number of input vertical synchronization (Vsync) pulses;
   a circuit to measure a phase difference between the first video signal and the second video signal;
   a circuit to generate an output video signal comprising a number of output Vsync pulses and an output clock; and
   a PLL circuit to control the output clock period as a constant ratio of the input Vsync period, and maintain a constant number of output clock periods per a finite number of input clock periods.

2. A circuit as in claim 1, wherein the circuit to measure the timing format of the first video signal comprises a circuit to measure a first VSync interval.

3. A circuit as in claim 1, wherein the circuit comprising a PLL circuit sets up a second VSync interval.

4. A circuit as in claim 1, comprising a flywheel block to provide a signal and control parameters to the PLL circuit.

5. A circuit as in claim 4, wherein the control parameters comprise a first coefficient and a second coefficient, such that the first coefficient and the second coefficient can have either of two values, depending on whether the PLL circuit is in a 'lock' or 'unlock' state.

6. A circuit as in claim 5, wherein the first coefficient multiplies the value of a phase difference between the first video signal and the second video signal, and the second coefficient multiplies an integrated value of the phase difference between the first video signal and the second video signal.

7. A circuit as in claim 6, wherein the first coefficient and the second coefficient are selected to obtain high bandwidth and high stability in synchronization of the first and second video signals.

8. A system to provide synchronization between a first video signal and a second video signal, comprising:
   a means for storing commands;
   a means for executing the commands;
   a means for capturing a first video signal;
   a means for measuring a timing format of the first video signal including an input clock, and counting a number of input Vsync pulses;
   a means for measuring a phase difference between the first video signal and the second video signal;
   a means for generating an output video signal comprising a number of output Vsync pulses and an output clock;
   a means for providing a PLL circuit to control the output clock period as a constant ratio of the input Vsync period, and maintain a constant number of output clock periods per a finite number of input clock periods; and
   a means for maintaining a constant ratio between the input Vsync pulses and the output Vsync pulses.

9. A system as in claim 8, further wherein:
   the means for storing commands comprises a memory device;
   the means for executing commands comprises a CPU;
   the means for measuring the timing format of the first video signal comprises a means for measuring a first VSync interval, and further comprising:
   a circuit and commands stored in the memory device which are executed by the CPU.

10. A system as in claim 8, further wherein:
    the means for storing commands comprises a memory device;
    the means for executing commands comprises a CPU;
    the means for providing a PLL circuit further comprises a circuit and commands stored in the memory device which are executed by the CPU to set up a second VSync interval.

11. A system as in claim 8, further wherein:
    the means for providing a PLL circuit further comprises a flywheel block to provide a signal and control parameters to the PLL circuit.

12. A system as in claim 11, wherein the control parameters comprise a first coefficient and a second coefficient, such that the first coefficient and the second coefficient can have either of two values, depending on whether the PLL circuit is in a 'lock' or 'unlock' state.

13. A system as in claim 12 wherein the first coefficient multiplies the value of a phase difference between the first video signal and the second video signal, and the second coefficient multiplies an integrated value of the phase difference between the first video signal and the second video signal.

14. A system as in claim 12 wherein the first coefficient and the second coefficient are selected to obtain high bandwidth and high stability in synchronization of the first and second video signals.

15. A method of providing synchronization between a first video signal and a second video signal, comprising:
    having a first video signal with a selected input timing format;
    having a second video signal with a selected output timing format;
    capturing the first video signal;

measuring the timing format of the first video signal including an input clock, and counting a number of input Vsync pulses;

measuring a phase difference between the first video signal and the second video signal;

generating an output video signal comprising a number of output Vsync pulses and an output clock; and using a PLL circuit to control the output clock period as a constant ratio of the input Vsync period, and maintain a constant number of output clock periods per a finite number of input clock periods.

16. A method as in claim 15 wherein adjusting the second video signal to the first video signal is performed only when the two video signals are within a preselected sync mask window.

17. A method as in claim 15 wherein adjusting the second video signal to the first video signal is performed by providing a modulation signal into the PLL circuit.

18. A method as in claim 17 wherein the modulation signal comprises at least one gain coefficient, further wherein the at least one gain coefficient is selected depending on a lock status bit.

19. A method as in claim 17 wherein the at least one gain coefficient comprises a first gain coefficient proportional to the measured phase difference between the first video signal and the second video signal, and also comprising a second gain coefficient proportional to the integrated phase difference between the first video signal and the second video signal over a preselected number of input and output video frames.

20. The method of claim 15 wherein adjusting the second video signal to the first video signal comprises performing a rounding, a saturating, and a shifting step on the measured phase difference between the first video signal and the second video signal to keep a modulation signal within a preselected bound.

21. The method of claim 17 wherein adjusting the second video timing signal to the first video timing signal comprises performing a rounding, a saturating, and a shifting step on the resulting modulation signal, to keep the modulation signal within a preselected bound.

* * * * *